(12) United States Patent
Morita et al.

(10) Patent No.: US 6,826,209 B1
(45) Date of Patent: Nov. 30, 2004

(54) ULTRABROAD-BAND VARIABLE-WAVELENGTH WAVELENGTH-MULTIPLEXED PULSE WAVEFORM SHAPING DEVICE

(75) Inventors: Ryuji Morita, Hokkaido (JP); Mikio Yamashita, Hokkaido (JP); Akira Suguru, Saitama (JP); Shigeru Morokawa, Tokyo (JP)

(73) Assignees: Japan Science and Technology Corporation, Kawaguchi (JP); Citizen Watch Co., Ltd., Tokyo (JP)

(*) Notice: Subject to any disclaimer, the term of this patent is extended or adjusted under 35 U.S.C. 154(b) by 65 days.

(21) Appl. No.: 10/149,987
(22) PCT Filed: Nov. 1, 2000
(86) PCT No.: PCT/JP00/07699
§ 371 (c)(1), (2), (4) Date: Jun. 13, 2002
(87) PCT Pub. No.: WO01/44863
PCT Pub. Date: Jun. 21, 2001

(30) Foreign Application Priority Data

Dec. 14, 1999 (JP) ............................................ 11-354871

(51) Int. Cl.[7] .................................................. H01S 3/10
(52) U.S. Cl. ................................ 372/26; 372/6; 372/22; 372/23; 372/31; 372/43; 372/98; 372/101
(58) Field of Search ............................. 372/83, 94, 19, 372/23, 25, 28, 26, 29.06, 31, 29.023

(56) References Cited

U.S. PATENT DOCUMENTS

| 5,263,039 A | | 11/1993 | Skupsky et al. | |
|---|---|---|---|---|
| 5,401,957 A | * | 3/1995 | Suzuki et al. | ........... 250/227.21 |
| 5,682,262 A | | 10/1997 | Wefers et al. | |
| 6,404,786 B1 | * | 6/2002 | Kondo et al. | .................. 372/22 |
| 6,483,858 B1 | * | 11/2002 | Hovater et al. | ................ 372/18 |

FOREIGN PATENT DOCUMENTS

| EP | 1241513 A1 | * | 9/2002 | ........... G02F/01/01 |
|---|---|---|---|---|
| JP | 2-12227 | | 1/1990 | |
| JP | 2001/174764 A | * | 6/2001 | ........... G02F/01/01 |

OTHER PUBLICATIONS

Mikio Yamashita, "Femto Byou Hikari Pulse no Hassei to Seigyo", O plus E, No. 176, pp. 76–83, Jul., 1994. See PCT search report.

* cited by examiner

Primary Examiner—Leon Scott, Jr.
(74) Attorney, Agent, or Firm—Westerman, Hattori, Daniels & Adrian, LLP

(57) ABSTRACT

An ultra-broadband, variable and multiple wavelength, waveform shaping apparatus is disclosed that excels with the ability to yield light pulses shaped in waveform, variable and multiple in wavelength over an ultra-broad bandwidth, the pulses being as short as in the order of pico-seconds or less, or even in the order of femto-seconds. The apparatus includes a light source (21) for a light pulse, an ultra-broadband light pulse generating unit (22) for producing from a light pulse, an ultra-broadband light pulse beam, a beam expander (24) for spatially expanding the beam in one direction (along the y-axis) in its cross section, and a wavelength dispersive unit (26) for dispersing wavelengths of light beam pulse while further spatially expanding the expanded beam along the x-axis, a two-dimensional spatial amplitude modulator (11) for selecting wavelength bands varying in center frequency along the y-axis, a two-dimensional space phase amplifier (12) for modulating a plurality of lights selected by wavelengths into different phases, and a beam reducing and waveform shaping unit (28) for reducing so phase modulated light beam pulse components along the x-axis while shaping them into desired waveforms, whereby multiple wavelength light pulses are formed, which have center their wavelengths varying along the y-axis and waveforms shaped independently of each other and as desired.

12 Claims, 8 Drawing Sheets

(a)

(b)

(a)

(b)

(a)

(b)

(c)

(d)

(a)

(b)

(c)

(a)

(b)

(a)

(b)

(a)

(b)

(c)

ULTRABROAD-BAND VARIABLE-WAVELENGTH WAVELENGTH-MULTIPLEXED PULSE WAVEFORM SHAPING DEVICE

TECHNICAL FIELD

The present invention relates to an ultra-broadband, variable and multiple wavelength, pulse waveform shaping apparatus for use in an optical pulse generator for generating light pulses variable and multiple in wavelength over an ultra-broad bandwidth, i.e., a pulse waveform shaping apparatus for shaping light pulses variable and multiple in wavelength over an ultra-broad bandwidth, in which an ultra-broadband light pulse is produced and is then subjected to two-dimensional modulations both In amplitude and phase effected in a beam of the light pulse.

BACKGROUND ART

Light pulse waveform shaping has hitherto been performed by passing a light pulse having a single preselected center wavelength through either a one-dimensional spatial phase modulator or a one-dimensional spatial amplitude modulator or a combination of the two, or passing a light pulse having a single preselected center wavelength through a two-dimensional spatial phase modulator.

Light pulse waveform shaping of this type is designed to shape the waveform of a light pulse having a single preselected center wavelength by using a dispersing element to spatially expand the light pulse in dependence on its wavelengths and to effect a phase or an amplitude modulation for each of its wavelength components.

As the literature for the case of using a one-dimensional spatial phase modulator and for the case of using a one-dimensional spatial amplitude modulator, here may be cited "A. M. Weiner, J. P. Heritage and E. M. Kirschner, J. Opt. Soc. Am. B5, 1563 (1988)".

Also, as the literature for the case of using both of them, here can be cited "M. M. Wefers and K. A. Nelson, Opt. Lett. 18, 2032 (1993)".

Further, as the literature for the case of using a two-dimensional spatial phase modulator, here may be cited "M. M. Wefers, K. A. Nelson and A. M. M. Weiners, Opt. Lett. 21, 746 (1996)".

In the instances shown in the past literature cited above, however, the use of either a one-dimensional spatial phase modulator or a one-dimensional spatial amplitude modulator or even the use of both of them permitted only light pulses of the single center wavelength shaped in waveform to be obtained.

On the other hand, the instance of using a two-dimensional spatial phase modulator made it possible to obtain light pulses varying in waveform with their spatial positions but having the same one wavelength, and thus again permitted only light pulses of the single center wavelength shaped in waveform to be obtained.

In view of the problem noted above, the present invention is aimed to provide an ultra-broadband, variable and multiple wavelength, waveform shaping apparatus that excels with the ability to yield light pulses shaped in waveform, variable and multiple in wavelength over an ultra-broad bandwidth, the pulses being as short as in the order of pico-seconds or less, or even in the order of femto-seconds.

DISCLOSURE THE INVENTION

In order to achieve the object mentioned above, the present invention provides as set forth in the appended claims an ultra-broadband, variable and multiple wavelength, pulse waveform shaping apparatus, characterized in that it comprises: an ultra-broadband light pulse producing means for receiving a fundamental wave light pulse having a bandwidth and broadening the bandwidth of said fundamental wave light pulse into an ultra-broadband range to produce an ultra-broadband light pulse in the form of a beam thereof; a beam expander means comprising a cylindrical lens for expanding the cross section of the said beam of ultra-broad band light pulse in one direction (say along a y-axis) to form an expanded beam of ultra-broadband light pulse and a diffraction grating or the like for dispersing wavelengths of the ultra-broadband light pulse of the said expanded beam in a direction orthogonal to the y-axis (say in a direction of an x-axis) to produce a beam of ultra-broadband light pulse with its cross section thus expanded two-dimensionally; a two-dimensional spatial amplitude modulator for applying amplitude modulation to the said two-dimensionally expanded ultra-broadband light pulse for each, independent of another, of rows each extending in the direction (along the x-axis) of such wavelength dispersion (y-rows: y1, y2, y3 and y4) to take out thereof, light pulse components having their mutually independent center wavelengths ($\lambda 1$, $\lambda 2$, $\lambda 3$, and $\lambda 4$) for those respective rows; a two-dimensional spatial phase modulator for applying phase modulation to the said light pulse components having their mutually independent center wavelengths ($\lambda 1$, $\lambda 2$, $\lambda 3$, and $\lambda 4$) for each of such rows, independent of another; and a cylindrical lens or a cylindrical mirror and a diffraction grating or a prism for reducing, and condensing into the direction of the said x-axis, the said light pulse components modulated by the said two-dimensional spatial amplitude modulator and the said two-dimensional spatial phase modulator, whereby a plurality of pulses shaped in waveform and controlled in amplitude and phase independently for each of said center wavelengths ensue at different positions on an output screen.

In the makeup mentioned above, the ultra-broadband light pulse generating means enables a fundamental wave light pulse to bring about a self-phase modulation effect and thereby to result in an expanded spectrum, or to bring about an induced phase modulation effect between such a fundamental wave pulse and a pulse generated by a nonlinear phenomenon that takes place using the fundamental wave pulse and thereby to result in an expanded spectrum and to produce an ultra-broadband light pulse. Compared with dispersing the wavelengths of a fundamental wave light pulse, dispersing the wavelength of an ultra-broadband light pulse enables the wavelengths in an ultra-broadband that contains wavelengths in an extremely wide range to be dispersed. Applying amplitude modulations with a selected pattern to given rows, each of which extends in the direction of wavelength dispersion, in the 2-dimensional amplitude modulator to establish amplitudes permits light components with their respective, preselected center wavelengths to be cut out over the broad range of wavelengths. Also, with the ability to apply amplitude modulations to all of the rows in the 2-dimensional amplitude modulator independently of one another, it is possible to cut out light components varying in center wavelength by the number of the rows. Then, applying phase modulations with a selected pattern to the rows in the 2-dimensional phase modulator which correspond to the given rows in the 2-dimensional amplitude modulator permits a particular phase that realizes the temporal waveform of a desired particular pulse train to be added to each of those different rows, independently of one another. The beam reducing and waveform shaping means designed to reduce the beam cross section selectively in the direction of wavelength dispersion, thereby to reshape the beam allows a light pulse outgoing from the 2-dimensional phase modulator to be reduced in cross section only in the direction in which each of the rows extends, namely in the direction of wavelength, thus permitting the shaped light pulse waveforms to appear at positions on the output screen which vary corresponding to the positions of those rows.

The ultra-broadband, variable and multiple wavelength, pulse waveform shaping apparatus set forth in the appended claims may, as set forth in the appended claims, further be characterized in that the said fundamental wave light pulse is an ultra-short pulse of pico-seconds or less generated by a laser light source.

The ultra-broadband, variable and multiple wavelength, pulse waveform shaping apparatus set forth in the appended claims may, as set forth in the appended claims, further be characterized in that the said light source for generating the said fundamental wave light pulse is any one of a solid state laser, a fiber laser, a semiconductor laser, a dye laser and an optical parametric laser, or a combination thereof with an amplifier system.

The ultra-broadband, variable and multiple wavelength, pulse waveform shaping apparatus set forth in the appended claims may, as set forth in the appended claims, further be characterized in that the said ultra-broadband high pulse producing means includes at least one nonlinear optical medium adapted for the said fundamental wave light pulse to be passed therethrough to bring about self-phase modulation and induced phase modulation effects whereby the said fundamental wave light pulse is broadened in spectrum into the said ultra-broadband range.

The ultra-broadband, variable and multiple wavelength, pulse waveform shaping apparatus set forth in the appended claims may, as set forth in the appended claims, further be characterized in that the said ultra-broadband light pulse produced by the said ultra-broadband light pulse producing means is a light pulse of pico-seconds or less.

The ultra-broadband, variable and multiple wavelength, pulse waveform shaping apparatus set forth in the appended claims may, as set forth in the appended claims, further be characterized in that the said nonlinear optical medium is a hollow fiber filled with either a gas or an ionized gas.

The ultra-broadband, variable and multiple wavelength, pulse waveform shaping apparatus set forth in the appended claims may, as set forth in the appended claims, further be characterized in that the said nonlinear optical medium is made of any one of a waveguide structure, a bulk structure, a thin film structure, a photonic crystalline structure, a photonic fiber and a liquid, or an optical combination of two or more thereof.

The ultra-broadband, variable and multiple wavelength, pulse waveform shaping apparatus set forth in the appended claims may, as set forth in the appended claims, further be characterized in that the said nonlinear optical medium has a third-order nonlinear optical property.

The ultra-broadband, variable and multiple wavelength, pulse waveform shaping apparatus set forth in the appended claims may, as set forth in the appended claims, further be characterized in that the said two-dimensional spatial amplitude modulator for establishing the amplitude of the said light transmitting and the said two-dimensional spatial phase modulator for establishing its phase are arranged orthogonal to the optical axis and in series with each other and are capable of establishing the said amplitude and phase independently of each other and for each of the rows, each extending in the direction of wavelength dispersion, independently of one another.

The ultra-broadband, variable and multiple wavelength, pulse waveform shaping apparatus set forth in the appended claims may, as set forth in the appended claims, further be characterized in that the said two-dimensional spatial amplitude modulator and the said two-dimensional spatial phase modulator are each subjected to a feedback control so as to provide desired pulses.

The ultra-broadband, variable and multiple wavelength, pulse waveform shaping apparatus set forth in the appended claims may, as set forth in the appended claims, further be characterized in that the said two-dimensional spatial amplitude modulator comprises a first ultra-broadband polarizing plate, a two-dimensional spatial phase modulator having a plurality of pixels, and a second ultra-broadband polarizing plate to which the said first ultra-broadband polarizing plate and a polarization axis of transmission extend perpendicular.

The ultra-broadband, variable and multiple wavelength, pulse waveform shaping apparatus set forth in the appended claims may, as set forth in the appended claims, further be characterized in that the said beam reducing and waveform shaping means for reducing the expanded beam cross section selectively in the direction of wavelength dispersion, thereby shaping the waveform of the light pulse, is made of a cylindrical lens or a cylindrical mirror for reducing the light beam in one direction and a diffraction grating or a prism for condensing wavelength components of the light beam reduced in the one direction, whereby a plurality of waveform shaped patterns are formed at different position of an output screen.

The apparatus as set forth in the appended claims may also be characterized in that the said nonlinear optical medium is made of any one of a waveguide structure, a bulk structure, a thin film structure, a photonic crystalline structure, a photonic fiber and a liquid, or an optical combination of two or more thereof.

The apparatus as set forth in the appended claims may also be characterized in that the said nonlinear optical medium has a third-order nonlinear optical property.

The apparatus as set forth in the appended claims may also be characterized in that the said two-dimensional spatial amplitude modulator includes a two-dimensional space filter for selecting different center amplitudes from the ultra-broadband light pulse.

The apparatus as set forth in the appended claims may also be characterized in that the said two-dimensional spatial amplitude modulator comprises a first ultra-broadband polarizing plate, a two-dimensional spatial phase modulator, and a second ultra-broadband polarizing plate of which the polarization axis is perpendicular to the polarization axis of the said first polarizing plate.

The present invention by taking a makeup as mentioned above makes it possible to produce a plurality of optical pulse trains variable and multiple in wavelength, each independently of another and simultaneously or synchronously with another.

If such light pulses variable in wavelength and shaped with waveforms as desired are used and a material is irradiated with those light pulses with controlled wavelengths adequate to cause the electron energy level resonance and controlled time intervals in such a shaped train of pulses adequate to cause the vibrational energy level resonance, it is made possible to effect what is called multi-dimensional, electron energy level and vibrational energy level dual and selective excitation, thereby to pave the way for application to the control of a chemical reaction and also to growth control.

BRIEF DESCRIPTION OF THE DRAWINGS

The present invention will better be understood from the following detailed description and the drawings attached hereto showing certain illustrative forms of embodiment of the present invention; in this connection, it should be noted that such forms of embodiment illustrated in the accompanying drawings hereof are intended in no way to limit the present invention but to facilitate an explanation and understanding thereof. In the drawings:

FIG. 5 diagrammatically illustrates the cross section of an ultra-broadband light pulse beam each after passing through a certain optical element in the present form of embodiment wherein FIG. 5(a) shows a light pulse beam outgoing from a spherical lens 5, FIG. 5(b) shows the cross section of a light pulse beam outgoing from a cylindrical lens for expanding the light pulse beam in its cross section in one direction and FIG. 5(c) shows the cross section of a light pulse beam outgoing from an entrance diffraction grating;

FIG. 6 illustrates a light pulse beam with a two-dimensional spread according to the illustrated form of embodiment wherein FIG. 6(a) is a beam cross sectional view of the ultra-broadband light beam and FIG. 6(b) is a diagram showing a spectral distribution $S(\lambda)$ of the ultra-broadband light beam;

FIG. 7 illustrates the wavelength cutout function of the two-dimensional spatial amplitude modulator in the illustrated form of embodiment wherein FIG. 7(a) is a diagram illustrating how the amplitude modulation by the two-dimensional spatial amplitude modulator is effected, and FIG. 7(b) is a diagram illustrating the spectral distribution $S(\lambda)$ after the cutout of wavelengths is effected by way of the amplitude modulation by the two-dimensional spatial amplitude modulator; and FIG. 8 illustrates the independent waveform shaping function by the two-dimensional spatial phase modulator in the illustrated form of embodiment wherein FIG. 8(a) is a diagram illustrating how phase modulation by the two-dimensional spatial phase modulator is effected, FIG. 8(b) is a cross sectional view of the beam outgoing from an exit diffraction grating, and FIG. 8(c) is a diagram illustrating pulses independently shaped in waveform and having different center wavelengths (ultra-broadband, variable wavelength, multiple wavelength, waveform shaped pulses).

BEST MODES FOR CARRYING OUT THE INVENTION

Hereinafter, an explanation is given in respect of suitable forms of embodiment of the ultra-broadband, variable and multiple wavelength, pulse waveform shaping apparatus of the present invention.

Figure 1:
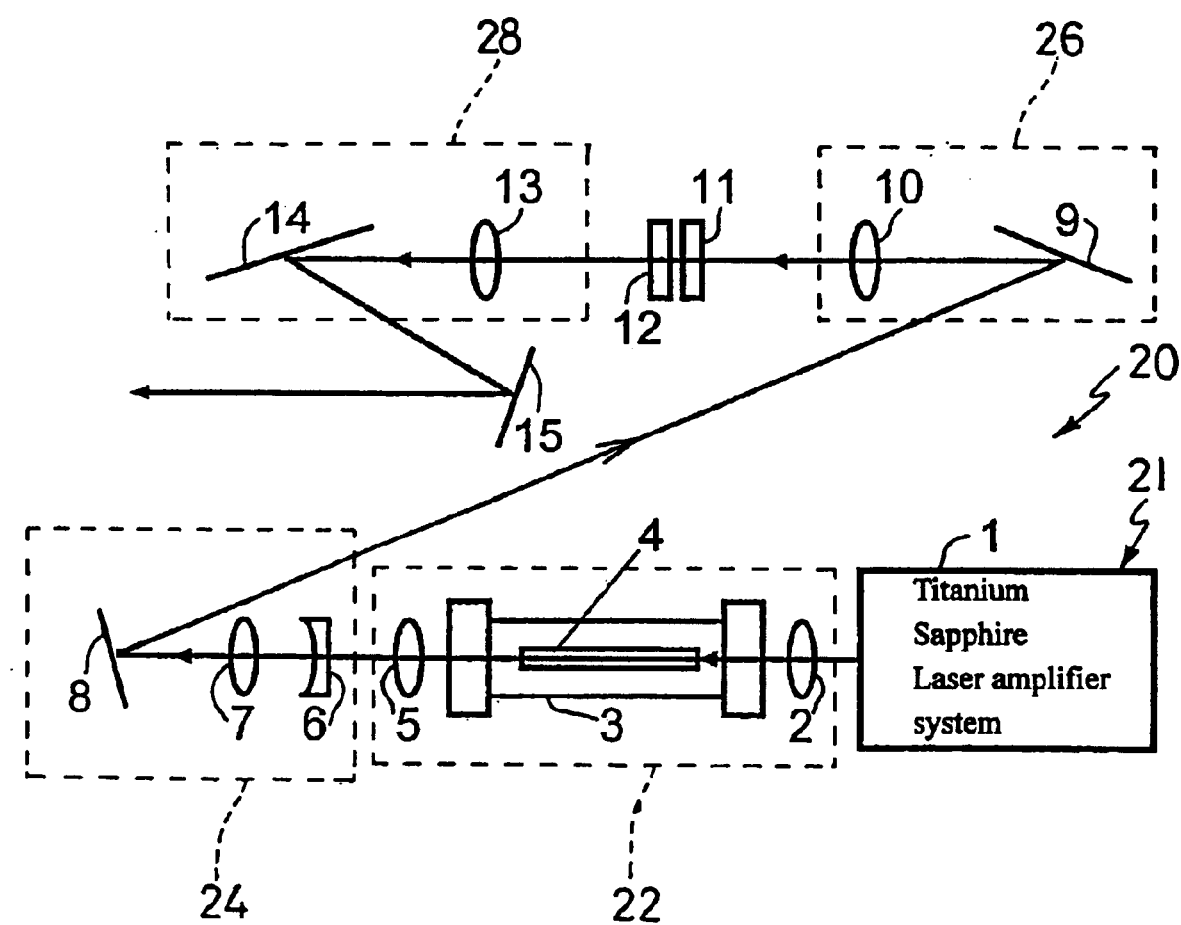
FIG. 1 is a makeup view diagrammatically illustrating one form of embodiment of the present invention.

FIG. 1 is a makeup view diagrammatically illustrating one form of embodiment of the ultra-broadband, variable and multiple wavelength, pulse waveform shaping apparatus of the present invention.

Referring to FIG. 1, this form of embodiment of the ultra-broadband, variable and multiple wavelength, pulse waveform shaping apparatus of the present invention, indicated by reference character 20, includes a light source 21 for generating an ultra-short light pulse that is short as in the order of pico-seconds or less, a first ultra-broadband light pulse generating unit 22 for broadening the bandwidth of the light pulse to produce an ultra-broadband light pulse in the form of a beam, a beam expander 24 for spatially expanding the beam of this ultra-broadband light pulse in a direction (which is here assumed to be along a y-axis) in a cross section of the beam to form an expanded beam of ultra-broadband light pulse, and a wavelength-dispersive unit 26 for dispersing wavelengths of the ultra-broadband light pulse of the expanded beam, while further expanding the beam, in another direction in a cross section of the beam, thereby forming an ultra-broadband light pulse with a beam cross section expanded two-dimensionally.

Here, the term "beam cross section" is used to refer to a cross section of the beam cut perpendicular to the direction in which the ultra-broadband light pulse propagates.

For the light source 21, use may be made of a laser system of any one of a solid-state laser, a fiber laser, a semiconductor laser, a dye laser and an optical parametric laser, or such a laser system combined with an amplifier system.

Also, for the first ultra-broadband light pulse generating unit 22 shown in FIG. 1, use is here made of a pressure chamber 3 filled with a gas, e.g., a rare gas and having a hollow fiber 4 disposed therein aligned with the optical axis of the laser system and the unit, but may be made simply of such a hollow fiber 4 alone that is filled with a rare gas and aligned with the optical axis.

Further, instead of a rare gas, the pressure chamber 3 may be held filled with an ionized gas produced, e.g., by applying a voltage across a pair of electrodes disposed at the opposite ends of the chamber 3 so that the hollow chamber 4 disposed therein can also be held filled with the ionized gas. Alternatively, the hollow fiber 4 alone may again be used that is aligned with the optical axis and here held filled with an ionized gas. The rare gas as the filler may also be replaced with a liquid.

The first ultra-broadband light pulse generating unit 22 is also shown to include an optical component such as a spherical lens 2 to condense the light pulse, and a collimator 5 that collimates the condensed light pulse, although they may be disposed separately outside of the unit.

Figure 2:
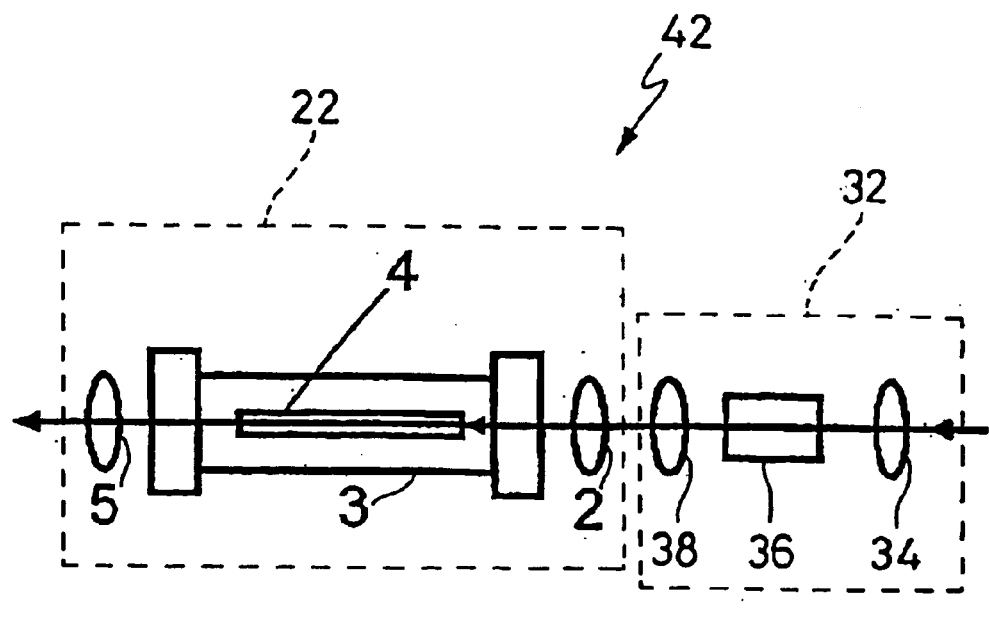
FIG. 2 illustrates further arrangements that may be adopted in embodying the ultra-broadband, variable and multiple wavelength, pulse waveform shaping apparatus of the present invention, including FIG. 2a that is a makeup view of the arrangement in which the first ultra-broadband light pulse generating unit has at its light incoming side a second ultra-broadband light pulse generating unit and FIG. 2b that is a makeup view of the arrangement in which the first ultra-broadband light pulse generating unit has at its light outgoing side a second ultra-broadband light pulse generating unit.
Figure 2:
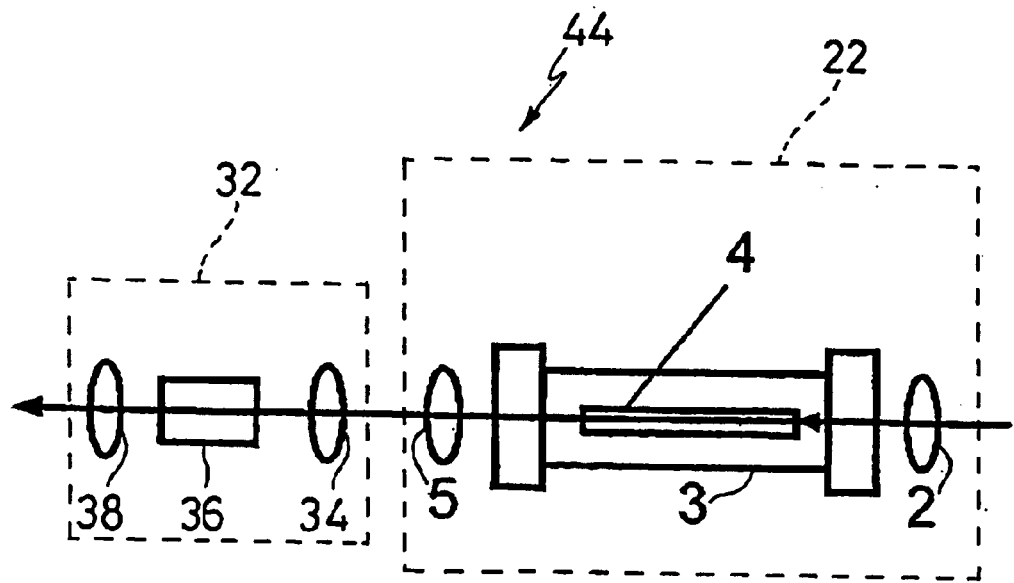

FIG. 2 illustrates further arrangements that may be adopted in embodying the ultra-broadband, variable and multiple wavelength, pulse waveform shaping apparatus of the present invention, including FIG. 2a that is a makeup view of the arrangement in which the first ultra-broadband light pulse generating unit has at its light incoming side a second ultra-broadband light pulse generating unit and FIG. 2b that is a makeup view of the arrangement in which the first ultra-broadband light pulse generating unit has at its light outgoing side a second ultra-broadband light pulse generating unit.

While ultra-broadband light pulse generating units, shown in FIGS. 2a and 2b and indicated by reference character 42 (and 44), respectively, are each a combination of the ultra-broadband light pulse generating unit 22 shown in FIG. 1 with the second ultra-broadband light pulse generating unit, indicated by reference character 32, the first ultra-broadband light pulse generating unit 22 in FIG. 1 may be replaced with the second ultra-broadband light pulse generating unit 32 alone.

The second ultra-broadband light pulse generating unit 32 shown in FIG. 2 includes a condensing element 34 and a collimator 38 and has a separate nonlinear optical medium structure 36 disposed on the optical axis between them. It should be noted in this connection that the hollow fiber 4 filled with a rare gas or ionized gas is an example of the nonlinear optical medium structure.

An ultra-broadband light pulse is obtainable when a fundamental wave pulse from a laser light source having a selected center wavelength is passed through a nonlinear optical medium to bring about a self-phase modulation effect and thereby to result in an expanded spectrum, or to bring about an induced phase modulation effect between such a fundamental wave pulse and a pulse generated by a nonlinear phenomenon that takes place using the fundamental wave pulse and thereby to result in an expanded spectrum. For the nonlinear optical medium, use may be made of many an inorganic or organic material that is large in the third-order nonlinear optical property. For the nonlinear optical medium structure, use may be made of a waveguide structure, a bulk structure, a thin film, a photonic crystalline structure, a photonic fiber structure or a liquid.

For the waveguide structure, any structure is sufficient if it can confine a light therein, and it may be a fiber or channel waveguide structure. For the bulk or the thin film, which is a structure that cannot confine a light therein but let it spread, but which can be formed from any material even though it is poor in machinability, use may thus be made of any inorganic or organic material that is large in the third-order nonlinear optical property. A photonic crystal is a structure in which atoms are arranged regularly with a period in the order of a light wavelength and is capable confining a light therein. A liquid if used may be filled in a transparent vessel.

In a most preferred form of embodiment of the present invention, as shown in connection with the first ultra-wideband light pulse generating unit the medium is a rare gas and the structure is a hollow fiber filled with a rare gas, and it is made of glass to form a waveguide structure.

The wavelength dispersive unit 26 in the form of embodiment illustrated may include a collimator in the form of a cylindrical lens or mirror, although they may be separately disposed outside of the unit.

The ultra-broadband, variable and multiple wavelength, pulse waveform shaping apparatus 20 in the illustrated form of embodiment of the present invention further includes a two-dimensional spatial amplitude modulator 11 for selecting along the y-axis, different wavelength ranges with their respective center wavelengths, of the light pulse beam expanded two-dimensionally, a two-dimensional spatial amplitude modulator 12 for phase-modulating a plurality of light components in the selected wavelength ranges individually, and a beam reducing and waveform shaping unit 28 for reducing the phase-modulated light pulse beam in the direction of x-axis in its beam cross section while shaping it into any waveform as desired to form a multiple wavelength light pulse shaped in waveform. While its detailed explanation is to be given later, for the condensing element use may be made of a cylindrical lens or mirror, and for the pulse waveform shaping section use may be a diffraction grating.

Figure 3:
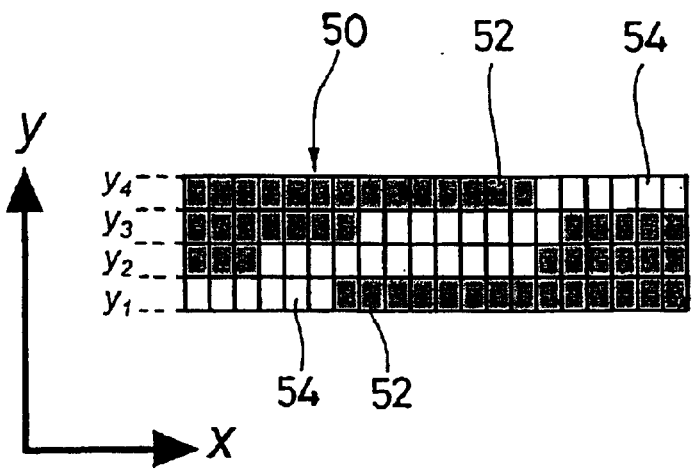
FIG. 3 conceptionally illustrates the makeup of a two-dimensional spatial amplitude modulator for use in the form of embodiment illustrated and includes FIG. 3a that illustrates in a conceptional view a two-dimensional space filter and FIG. 3b that illustrates in a spectrum view the wavelength cutout.
Figure 3:
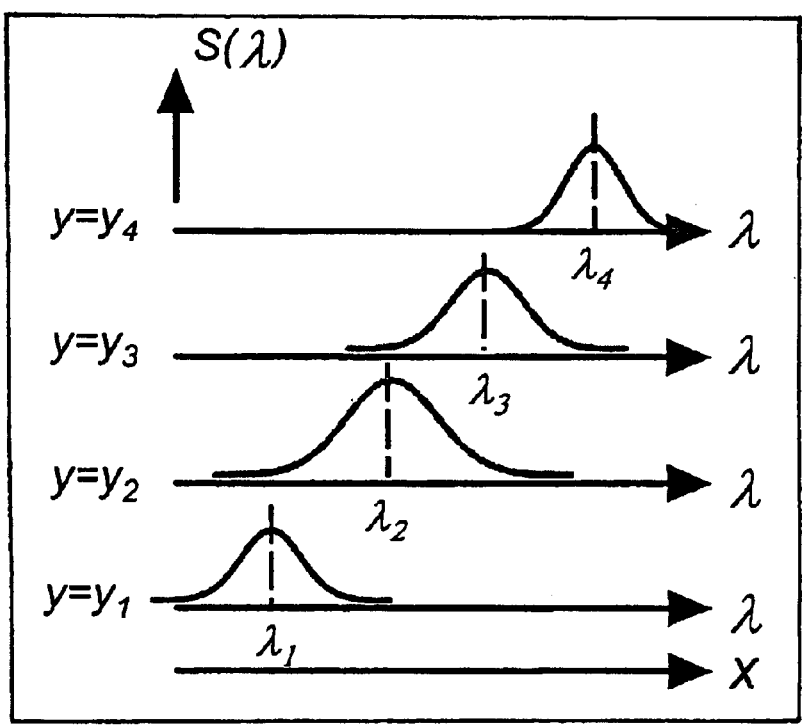

FIG. 3 conceptionally illustrates the makeup of a two-dimensional spatial amplitude modulator for use in the form of embodiment illustrated and includes FIG. 3a that illustrates in a conceptional view a two-dimensional space filter and FIG. 3b that illustrates in a spectrum view the cutout of wavelengths. As shown in FIG. 3, the two-dimensional spatial amplitude modulator has a two-dimensional space filter 50, e.g., with an array of pixels being 648 (in the direction of x-axis)×4 (in the direction of y-axis) in number, which is provided with regions 54 transparent, and regions 52 nontransparent to, the light pulse beam. Thus, passing the ultra-broadband light pulse through the 2-dimensional space filter 50 allows different center wavelengths as shown in FIG. 3b to be selected and in effect the wavelengths to be cut out.

Figure 4:
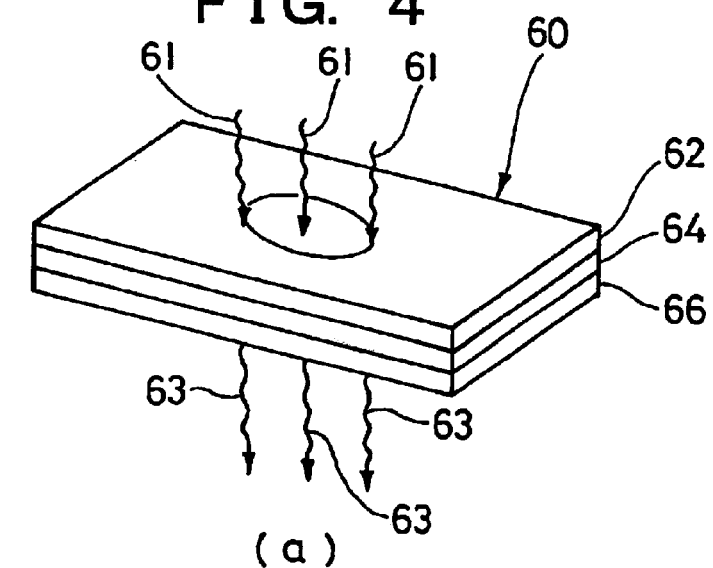
FIG. 4 conceptionally illustrates the makeup of another two-dimensional spatial amplitude modulator for use in the form of embodiment illustrated and includes FIG. 4a that illustrates in a conceptional view the makeup of another two-dimensional spatial filter, FIG. 4b that illustrates an ultra-broadband polarizing plate, FIG. 4c that illustrates a two-dimensional spatial phase modulator and FIG. 4d that illustrates another ultra-broadband polarizing plate.
Figure 4:
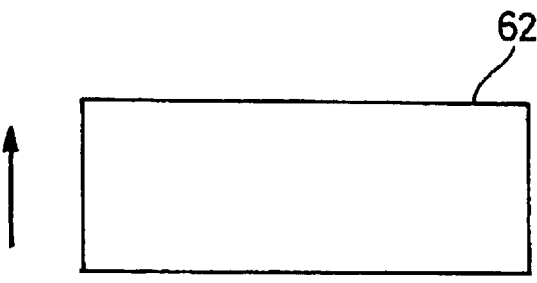
Figure 4:
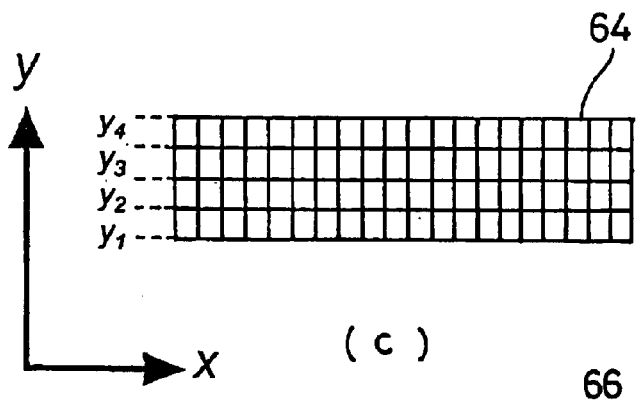
Figure 4:
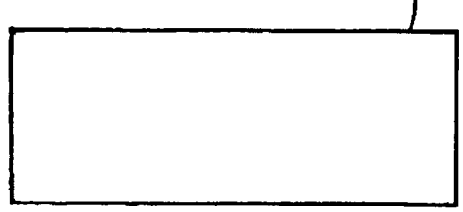

FIG. 4 conceptionally illustrates the makeup of another two-dimensional spatial amplitude modulator for use in the form of embodiment illustrated and includes FIG. 4a that illustrates in a conceptional view the makeup of another two-dimensional space filter, FIG. 4b that illustrates an ultra-broadband polarizing plate, FIG. 4c that illustrates a two-dimensional spatial phase modulator and FIG. 4d that illustrates another ultra-broadband polarizing plate.

The two-dimensional spatial amplitude modulator, 60, shown in FIG. 4 is formed with the first ultra-broadband polarizing plate, 62, the two-dimensional spatial phase modulator, 64, with an array of pixels being 648 (in the direction of x-axis)×4 (in the direction of y-axis)in number and the second ultra-broadband polarizing plate, 66, having an axis of light polarization orthogonal to that of the first ultra-broadband polarizing plate 62, wherein the members 62, 64 and 66 are laid one on top of another. In this two-dimensional spatial amplitude modulator 60, varying the two-dimensional spatial phase modulator 64 in phase varies the amount of light transmitted through the two orthogonal ultra-broadband polarizing plates. This permits a two-dimensional amplitude modulation to be effected. Further, what is indicated by numeral 61 in FIG. 4a represents an ultra-broadband light pulse expanded two-dimensionally, and what is indicated by numeral 63 represents an ultra-broadband light pulse modulated in amplitude two-dimensionally. Also, indicated by the arrows in FIGS. 4b and 4c are the directions of the polarization axises of those plates, the light having whose polarization direction is only transmissive.

Mention is next made of an operation of this form of embodiment of the invention.

In the ultra-broadband, variable and multiple wavelength, pulse waveform shaping apparatus 20 made up as mentioned above, an ultra-broadband light pulse as short as picoseconds or less is produced and used, which has wavelengths extending over an ultra-broadband between 500 nm and 1000 nm.

A beam of this ultra-broadband light pulse is spatially expanded in one direction of its cross section, say in the direction of y-axis, by using the beam expander 24, by such as a pair of cylindrical lenses or mirrors therein. The beam of ultra-broadband light pulse so spatially expanded is then subjected to wavelength dispersion and second spatial expansion both by the waveform dispersive unit 26 wherein it is spatially expanded in another direction in the same cross section orthogonal to that one section, say in the direction of an x-axis orthogonal to the y-axis.

The resulting ultra-broadband light pulse, then after having been collimated by the collimator such as a cylindrical lens or mirror in the wavelength dispersive unit 26, is subjected in the 2-dimensional spatial amplitude modulator 11 to selection or extraction of different wavelength ranges with their respective center wavelengths (cutout of wavelengths) in the direction of y-axis. A resultant plurality of light components with the wavelengths selected is then phase-modulated by the 2-dimensional spatial phase modulator 12 into different phases.

A resultant ultra-broadband light pulse phase-modulated is reduced in its beam cross section in the direction of x-axis and thereafter shaped into a waveform as desired, both by the beam reducing and waveform shaping unit 28. Here, reducing the ultra-broadband light pulse in its beam cross section in the direction of x-axis corresponds to removing its spread in the direction of x-axis which it had when the wavelengths were dispersed. This makes it possible to derive light pulses with their center wavelengths varying depending on positions in the direction of y-axis and shaped with any waveform as desired and independently of one another, namely multiple wavelength light pulses shaped in wave form.

In this case, monitoring the center wavelength and waveform of each shaped pulse derived to effect feedback control allows the desired center wavelength and waveform to be obtained.

Mention is next made of a specific makeup of the above-mentioned form of embodiment as well as effects and advantages thereof with reference to FIGS. 1 and 5 to 8.

As mentioned previously, FIG. 1 is a conceptual makeup view showing one form of embodiment of the ultra-broadband variable and multiple wavelength pulse waveform shaping apparatus according to the present invention. The cylindrical lens has a curvature, and the diffraction grating has grooves, both along the y-axis.

Figure 5:
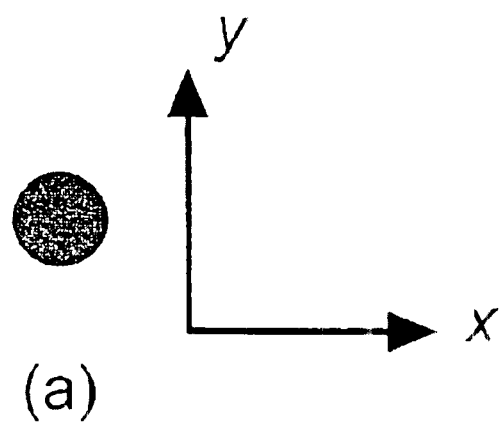
Figure 5:
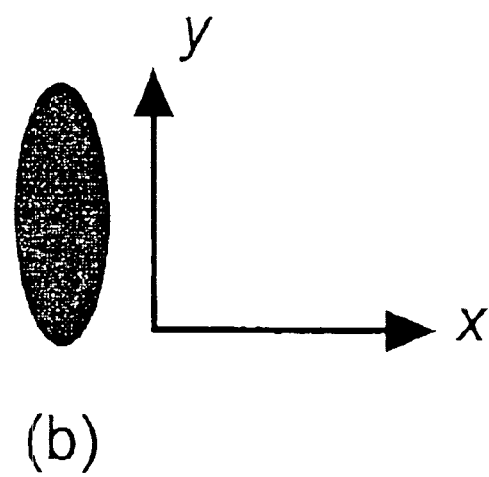
Figure 5:
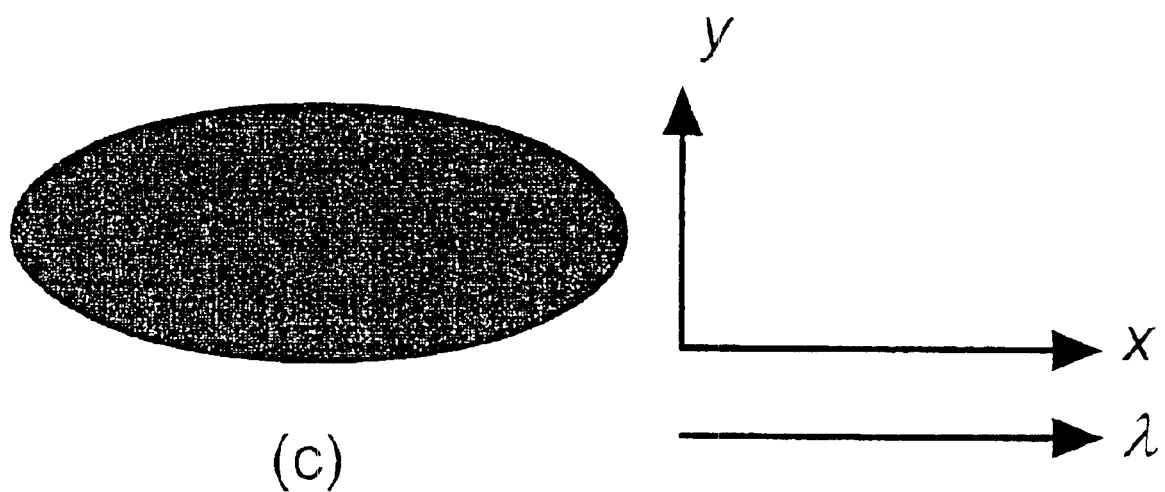

FIG. 5 diagrammatically illustrates the cross section of an ultra-broadband light pulse beam each after passing through a certain optical element in the present form of embodiment wherein FIG. 5(*a*) shows a light pulse beam outgoing from the spherical lens 5, FIG. 5(*b*) shows the cross section of a light pulse beam outgoing from the cylindrical lens 6, 7 for expanding the light pulse beam in its cross section in one direction and FIG. 5(*c*) shows the cross section of a light pulse beam outgoing from the entrance diffraction grating 9.

Figure 6:
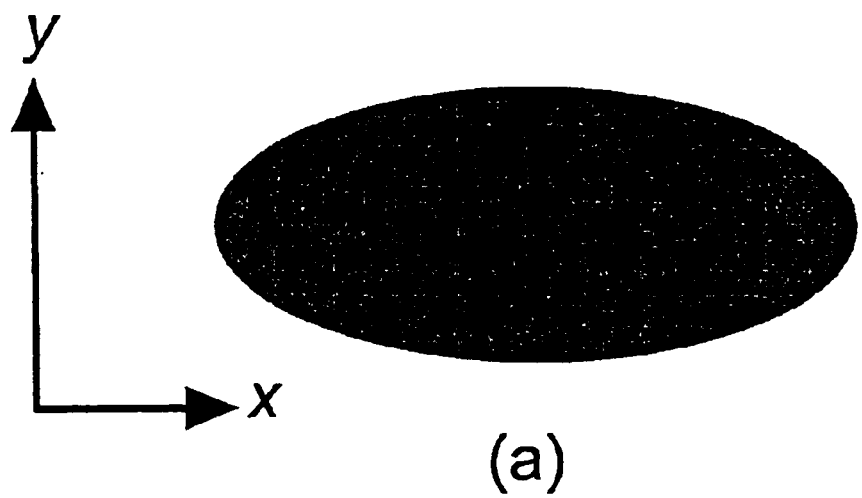
Figure 6:
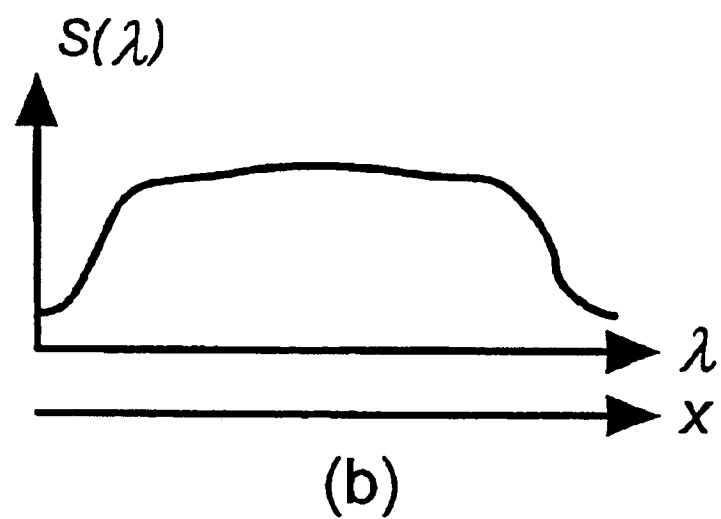
Figure 7:
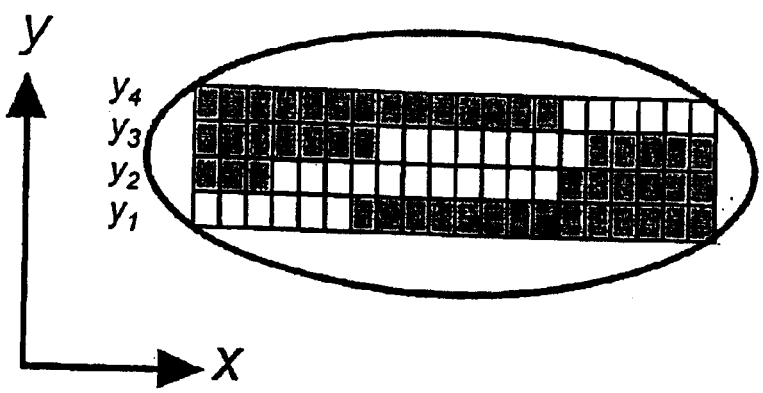
Figure 7:
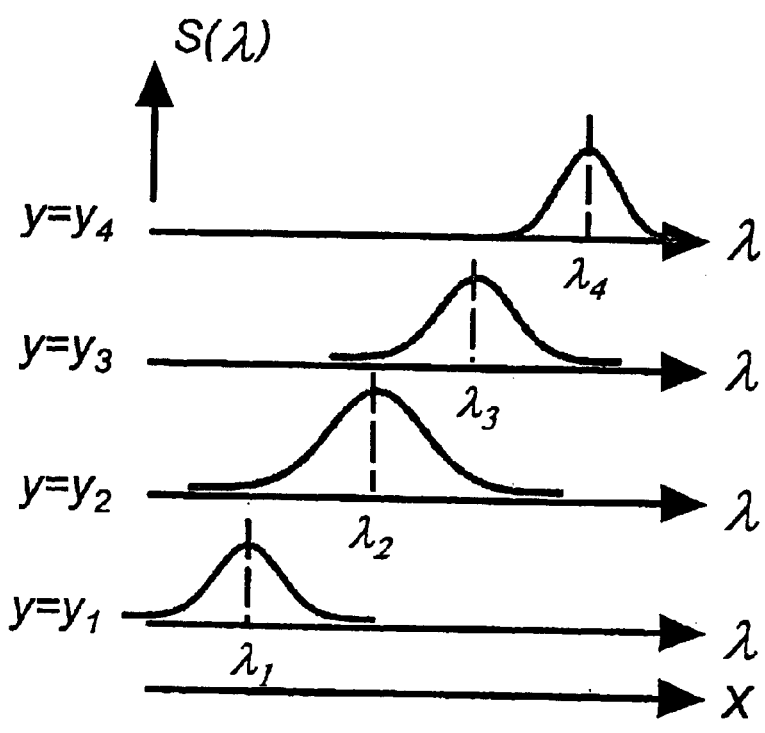
Figure 8:
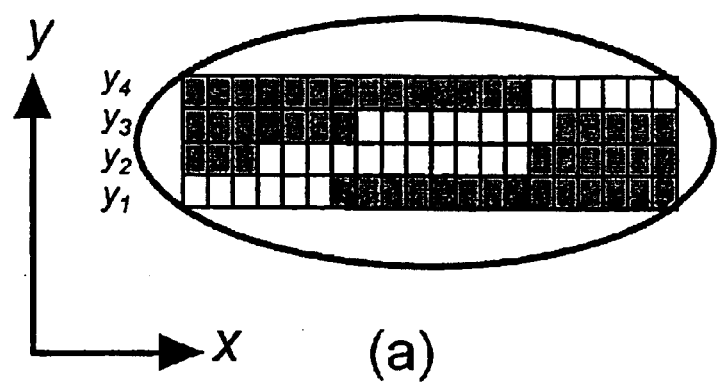
Figure 8:
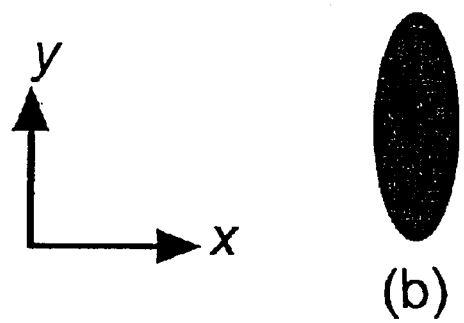
Figure 8:
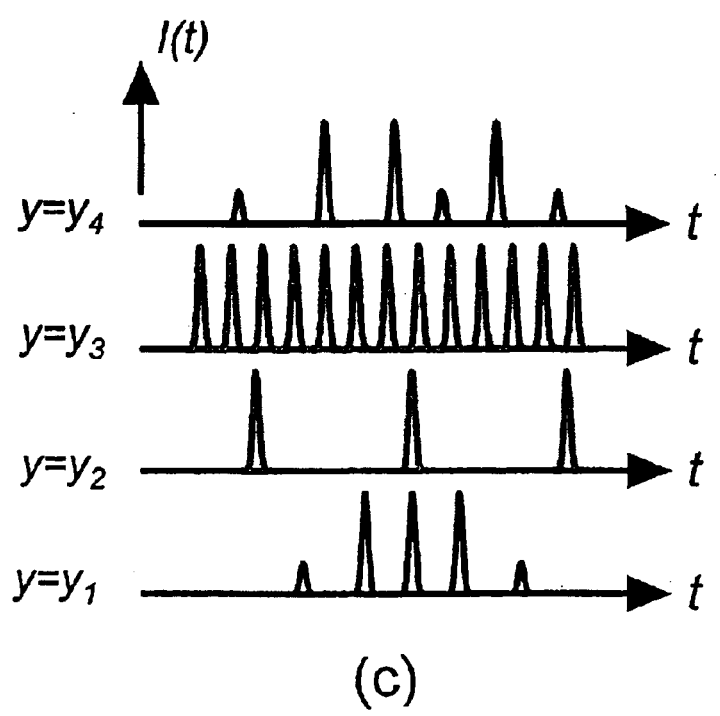

FIGS. 6, 7 and 8 show in explanatory views the wavelength cutout function of the two-dimensional spatial amplitude modulator and the independent waveform shaping function by the 2-dimensional spatial phase modulator.

Referring to FIG. 1, in the ultra-broadband variable and multiple wavelength pulse waveform shaping apparatus of the illustrated form of embodiment, a light pulse having a center wavelength of 790 nm, a pulse width of 30 fs, a pulse energy of 0.6 mJ and a repetition rate of 1 kHz is generated by a titanium-sapphire laser amplifier system as the light source 1. Then, using the spherical lens 2 having a focal length of 200 mm, the light pulse is condensed and guided into the ultra-broadband light pulse generating unit 22, which produces an ultra-broadband light pulse of a wavelength range of 500 to 1000 nm.

The ultra-broadband light pulse generating unit 22 is made of a pressure chamber 3 having, e.g., a sapphire made light inlet and outlet window and filled with argon at a pressure of 3.3 atm and a quartz made hollow fiber 4 having an inner diameter of 0.1 mm and a length of 300 mm. The ultra-broadband light pulse generating unit 22 is thus designed so that a light pulse condensed is received at the light entrance end of the quartz made hollow fiber 4.

The resultant ultra-broadband light pulse is then collimated by the spherical lens 5 having a focal length of 200 mm as the collimator, becoming a beam of light whose cross section is shown in FIG. 5(*a*). Then, the light beam is expanded in its cross section in the direction of y-axis by the beam expander unit 24 comprising the cylindrical lens 6 having a focal length of 20 mm and the cylindrical lens 7 having a focal length of 150 mm. The cross section of the expanded beam is shown in FIG. 5(*b*).

The light pulse beam expanded in the direction of y-axis, then after having been reflected by a planar mirror 8, is subjected to wavelength dispersion by the waveform dispersive unit comprising the entrance diffraction grating 9 having a grating constant of 600/mm, which expands the beam cross section in the direction of x-axis. The light so expanded is then collimated by the collimator comprising a cylindrical lens 10 having a curvature along the x-axis and a focal length of 150 mm.

The light pulse beam has now had a beam cross section that expands out two-dimensionally in both the directions of x- and y-axes as shown in FIG. 5(*c*) also indicating that the direction of x-axis corresponds to that of the axis of wavelength $\lambda$, $\lambda$-axis. The relationship between the spread and the spectrum which the beam then has is indicated in FIGS. 6(*a*) and 6(*b*). Here, FIG. 6(*a*) is a beam cross sectional view of the ultra-broadband light beam on the two-dimensional spatial amplitude modulator while FIG. 6(*b*) is a diagram showing a spectral distribution $S(\lambda)$ of the ultra-broadband light beam on the two-dimensional spatial amplitude modulator (indicating that the $\lambda$-axis is coincident with the x-axis in the beam cross section).

As shown in FIGS. 6(*a*) and 6(*b*), while the beam cross section has the same wavelength components along the y-axis, it has wavelength components widely distributed along the x-axis corresponding to its spectral distribution $S(\lambda)$ since the direction of x-axis is coincident with that of the axis of wavelength $\lambda$.

This two-dimensionally spread light pulse is passed through the two-dimensional spatial amplitude modulator 11 having an array of pixels, for example, 648 (along the x-axis)×4 (along the y-axis) in number. This array provides as shown in FIG. 7, four (y1, y2, y3 and y4 rows of) one-dimensional spatial amplitude modulators each of which comprises an array of pixels 648×1 within the cross section of the light pulse beam. If for these 1-st to 4-th rows of different amplitude modulations are applied, then wavelength components whose center wavelengths vary from one another, $\lambda 1$, $\lambda 2$, $\lambda 3$ and $\lambda 4$, can be taken out (the cutout of wavelengths).

Here, FIG. 7(*a*) is a diagram illustrating how amplitude modulation by the two-dimensional spatial amplitude modulator is effected, while FIG. 7(*b*) is a diagram illustrating the spectral distribution $S(\lambda)$ after the cutout of wavelengths effected by way of amplitude modulation of the two-dimensional spatial amplitude modulator.

Then, the light pulse with its center wavelengths cut out that vary depending on positions along the y-axis is passed through the two-dimensional spatial phase modulator comprising an array of pixels 648 (along the x-axis)×4 (along the y-axis) in number and having a maximum amount of phase modulation less than 2π, and thereby subjected to phase modulation for each of the y1 row to the y4 row. Then, the beam cross section as shown in FIG. 8(a) comes to have a phase modulation applied thereto for each of the pixels independently of one another. Here, FIG. 8(a) is a diagram illustrating how phase modulation by the two-dimensional spatial phase modulator is effected, FIG. 8(b) is a cross sectional view of the beam outgoing from an exit diffraction grating 14, and FIG. 8(c) is a diagram illustrating pulses independently shaped in waveform and having different center wavelengths (namely an ultra-broadband, variable wavelength, multiple wavelength, waveform shaped pulses).

Thereafter, by using the cylindrical lens 13 having a curvature along the x-axis and a focal distance of 150 mm, the light pulse beam is condensed on the diffraction grating 14 into the direction of x-axis. Then, the light pulse beam diffracted by the exit diffraction grating 14, whose beam cross section at this point of time is as shown in FIG. 8(b), provides a pulse shaped in waveform having a center frequency λ1 at a position y1, a pulse shaped in waveform having a center frequency λ2 at a position y2, a pulse shaped in waveform having a center frequency λ3 at a position y3, and a pulse shaped in waveform having a center frequency λ4. Then, the respective pulse shaping patterns can be controlled each independently of one another to provide respective trains of pulses each of a waveform as desired. It is FIG. 8(c) which shows temporal waveforms of such independently shaped trains of pulses (which are shown in terms of pulse intensity versus time: I(t)).

Finally, a mirror 15 adjusts the directions in which ultra-broadband variable wavelength, wavelength multiple, waveform shaped pulses thus generated are to propagate.

Although the present invention has hereinbefore been set forth with respect to certain illustrative forms of embodiment thereof, it will readily be appreciated to be obvious to a person skilled in the art that many alternations thereof, omissions therefrom and additions thereto can be made without departing from the essences and scope of the present invention. Accordingly, it should be understood that the invention is not intended to be limited to the specific forms of embodiment thereof set forth below, but to include all possible forms of embodiment thereof that can be made within the scope with respect to the features specifically set forth in the appended claims and encompasses all the equivalents thereof.

Industrial Applicability

An ultra-broadband, variable and multiple wavelength, pulse waveform shaping apparatus according to the present invention, with the use of a two-dimensional spatial amplitude modulator and a two-dimensional phase modulator, is capable of producing ultra-broadband light pulses, and generating a plurality of trains of optical pulses with wavelengths variable in an ultra-broadband, independently of one another but concurrently or even synchronously, and thus in a manner hitherto hard to effect. Accordingly, if a material is irradiated with such ultra-broadband light pulses with controlled wavelengths adequate to cause the electron energy level resonance and controlled time intervals in such a shaped train of pulses adequate to cause the vibrational energy level resonance, it is made possible to effect what is called multi-dimensional, electron energy level and vibrational energy level dual and selective excitation.

This makes it possible to control a reaction for a material, to control growth, to create a new material, to control a molecular function and to perform a selective excitation treatment.

The present invention is also applicable to optical information and transmission processing and optical computing by temporal, multiple wavelength and temporal parallel control and is thus extremely great in its industrial value.

What is claimed is:

1. An ultra-broadband, variable and multiple wavelength, pulse waveform shaping apparatus, comprising:
    an ultra-broadband light pulse producing means for receiving a fundamental wave light pulse having a bandwidth and broadening the bandwidth of said fundamental wave light pulse into an ultra-broadband range to produce an ultra-broadband light pulse in the form of a beam;
    a beam expander means comprising a cylindrical lens for expanding a cross section of said beam of ultra-broad band light pulse in a y-axis to form an expanded beam of ultra-broadband light pulse and a diffraction grating for dispersing wavelengths of the ultra-broadband light pulse of said expanded beam in an x-axis orthogonal to the y-axis to produce a beam of ultra-broadband light pulse with its cross section thus expanded two-dimensionally;
    a two-dimensional spatial amplitude modulator for applying amplitude modulation to said two-dimensionally expanded ultra-broadband light pulse wherein each, independent of one another, form a plurality of independent rows y1, y2, y3, y4 • • each extending along the the x-axis of such wavelength dispersion to take out light pulse components having mutually independent center wavelengths λ1, λ2, λ3, λ4 • • each corresponding to each of the plurality of independent rows;
    a two-dimensional spatial phase modulator for applying phase modulation to said light pulse components having their mutually independent center wavelengths λ1, λ2, λ3, and λ4 • • for each of said plurality of rows, independent of one another; and
    a beam reducing and waveform shaping means comprising a cylindrical lens or a cylindrical mirror and a diffraction grating or a prism for reducing, and condensing into a direction along said x-axis, said light pulse components modulated by said two-dimensional spatial amplitude modulator and said two-dimensional spatial phase modulator,
    whereby a plurality of pulses shaped in waveform and controlled in amplitude and phase independently for each of said center wavelengths are ensue to be display at different positions on an output screen.

2. An ultra-broadband, variable and multiple wavelength, pulse waveform shaping apparatus as set forth in claim 1, wherein said fundamental wave light pulse is an ultra-short pulse of pico-seconds or less generated by a laser light source.

3. An ultra-broadband, variable and multiple wavelength, pulse waveform shaping apparatus as set forth in claim 2, wherein said light source for generating said fundamental wave light pulse is any one of a solid state laser, a fiber laser, a semiconductor laser, a dye laser and an optical parametric laser, or a combination thereof with an amplifier system.

4. An ultra-broadband, variable and multiple wavelength, pulse waveform shaping apparatus as set forth in claim 1, wherein said ultra-broadband light pulse producing means includes at least one nonlinear optical medium adapted for said fundamental wave light pulse to be passed therethrough to bring about self-phase modulation and induced phase modulation effects, whereby said fundamental wave light pulse is broadened in spectrum into said ultra-broadband range.

5. An ultra-broadband, variable and multiple wavelength, pulse waveform shaping apparatus as set forth in claim 4, wherein said ultra-broadband light pulse produced by said ultra-broadband light pulse producing means is a light pulse of pico-seconds or less.

6. An ultra-broadband, variable and multiple wavelength, pulse waveform shaping apparatus as set forth in claim 4, wherein said nonlinear optical medium is a hollow fiber filled with either a gas or an ionized gas.

7. An ultra-broadband, variable and multiple wavelength, pulse waveform shaping apparatus as set forth in claim 4, wherein said nonlinear optical medium is made of any one of a waveguide structure, a bulk structure, a thin film structure, a photonic crystalline structure, a photonic fiber and a liquid, or an optical combination of two or more thereof.

8. An ultra-broadband, variable and multiple wavelength, pulse waveform shaping apparatus as set forth in claim 4, wherein said nonlinear optical medium has a third-order nonlinear optical property.

9. An ultra-broadband, variable and multiple wavelength, pulse waveform shaping apparatus as set forth in claim 1, wherein said two-dimensional spatial amplitude modulator for establishing the amplitude of said light transmitting and said two-dimensional spatial phase modulator for establishing its phase are arranged orthogonal to the optical axis and in series with each other are capable of establishing said amplitude and phase independently of each other and for each of the rows, each extending in the direction of wavelength dispersion, independent of one another.

10. An ultra-broadband, variable and multiple wavelength, pulse waveform shaping apparatus as set forth in claim 9, wherein said two-dimensional spatial amplitude modulator and said two-dimensional spatial phase modulator are each subjected to a feedback control so as to provide desired pulses.

11. An ultra-broadband, variable and multiple wavelength, pulse waveform shaping apparatus as set forth in claim 9, wherein said two-dimensional spatial amplitude modulator comprises a first ultra-broadband polarizing plate, a two-dimensional spatial phase modulator having a plurality of pixels, and a second ultra-broadband polarizing plate to which said first ultra-broadband polarizing plate whose polarizing axis is perpendicular to the polarizing axis of said first polarizing plate.

12. An ultra-broadband, variable and multiple wavelength, pulse waveform shaping apparatus as set forth in claim 1, wherein said beam reducing and waveform shaping means for reducing the expanded beam cross section selectively in the direction of wavelength dispersion, thereby shaping the waveform of the light pulse, is made of a cylindrical lens or a cylindrical mirror for reducing the light beam in one direction and a diffraction grating or a prism for condensing wavelength components of the light beam reduced in the one direction, whereby a plurality of waveform shaped patterns are formed at different position of an output screen.

* * * * *